US012628436B2

(12) United States Patent
Xu et al.

(10) Patent No.: US 12,628,436 B2
(45) Date of Patent: May 12, 2026

(54) HETEROJUNCTION CELL AND METHOD FOR PREPARING SAME

(71) Applicant: ANHUI HUASUN ENERGY CO., LTD., Xuancheng (CN)

(72) Inventors: Xiaohua Xu, Xuancheng (CN); Ke Xin, Xuancheng (CN); Su Zhou, Xuancheng (CN); Daoren Gong, Xuancheng (CN); Wenjing Wang, Xuancheng (CN); Chen Li, Xuancheng (CN); Mengying Chen, Xuancheng (CN); Shangzhi Cheng, Xuancheng (CN)

(73) Assignee: ANHUI HUASUN ENERGY CO., LTD., Xuancheng (CN)

( * ) Notice: Subject to any disclaimer, the term of this patent is extended or adjusted under 35 U.S.C. 154(b) by 112 days.

(21) Appl. No.: 18/576,949

(22) PCT Filed: Jun. 24, 2022

(86) PCT No.: PCT/CN2022/101226
§ 371 (c)(1),
(2) Date: Jan. 5, 2024

(87) PCT Pub. No.: WO2023/279989
PCT Pub. Date: Jan. 12, 2023

(65) Prior Publication Data
US 2024/0243212 A1     Jul. 18, 2024

(30) Foreign Application Priority Data
Jul. 7, 2021   (CN) .......................... 202110767660.2

(51) Int. Cl.
H10F 10/174      (2025.01)
H10F 71/00      (2025.01)
H10F 77/14      (2025.01)

(52) U.S. Cl.
CPC ....... *H10F 10/174* (2025.01); *H10F 71/1221* (2025.01); *H10F 77/14* (2025.01)

(58) Field of Classification Search
CPC .... H10F 10/174; H10F 71/1221; H10F 77/14; H10F 71/103; H10F 71/1035;
(Continued)

(56) References Cited

U.S. PATENT DOCUMENTS 4,379,943 A * 4/1983 Yang ....................... H10F 10/17
136/258
2002/0069911 A1 6/2002 Nakamura et al.

FOREIGN PATENT DOCUMENTS

CN        101882642 A    11/2010
CN        103681935 A    3/2014
(Continued)

OTHER PUBLICATIONS

English CN-111628032-A (Year: 2020).*
(Continued)

*Primary Examiner* — Angelo Trivisonno
(74) *Attorney, Agent, or Firm* — Maschoff Brennan

(57) ABSTRACT

A heterojunction cell and a method for preparing same. The heterojunction cell comprises: a semiconductor substrate layer; and an intrinsic semiconductor composite layer, wherein the intrinsic semiconductor composite layer is located on the surface of at least one side of the semiconductor substrate layer, and the intrinsic semiconductor composite layer comprises: a bottom intrinsic layer; and a wide-band-gap intrinsic layer, which is located on the surface of the side of the bottom intrinsic layer that is away from the semiconductor substrate layer, the band gap of the wide-band-gap intrinsic layer being greater than the band gap of the bottom intrinsic layer. The band gap of a wide-band-gap intrinsic layer is larger, and when sunlight irradi-
(Continued)

ates a heterojunction cell, photons, the energy of which is less than that of the band gap of the wide-band-gap intrinsic layer, cannot be subjected to parasitic absorption.

15 Claims, 4 Drawing Sheets

(58) Field of Classification Search
CPC .. H10F 10/166; H10F 77/1223; H10F 77/147; Y02E 10/50; Y02E 10/548; Y02P 70/50
See application file for complete search history.

(56) References Cited

FOREIGN PATENT DOCUMENTS

| | | | | |
|---|---|---|---|---|
| CN | 104393090 | A | 3/2015 | |
| CN | 105895715 | A | 8/2016 | |
| CN | 106449850 | A | 2/2017 | |
| CN | 111628032 | A * | 9/2020 | ............. H10F 71/03 |
| CN | 112002779 | A | 11/2020 | |
| CN | 112768549 | A | 5/2021 | |
| CN | 113471312 | A | 10/2021 | |
| JP | 2002076409 | A | 3/2002 | |
| JP | 2014072406 | A | 4/2014 | |
| WO | 2013179529 | A1 | 12/2013 | |

OTHER PUBLICATIONS

Search Report dated Sep. 23, 2024 for European patent application No. 22836743.9.
First Office Action dated Mar. 4, 2024 for Japanese patent application No. 2024-501097.
First Office Action dated Nov. 28, 2022 for Chinese patent application No. 202110767660.2.
International Search Report and Written Opinion of the International Searching Authority for PCT Patent application No. PCT/CN2022/101226.
Second Office Action dated Aug. 19, 2025 for JP patent application No. 2024-501097.

* cited by examiner

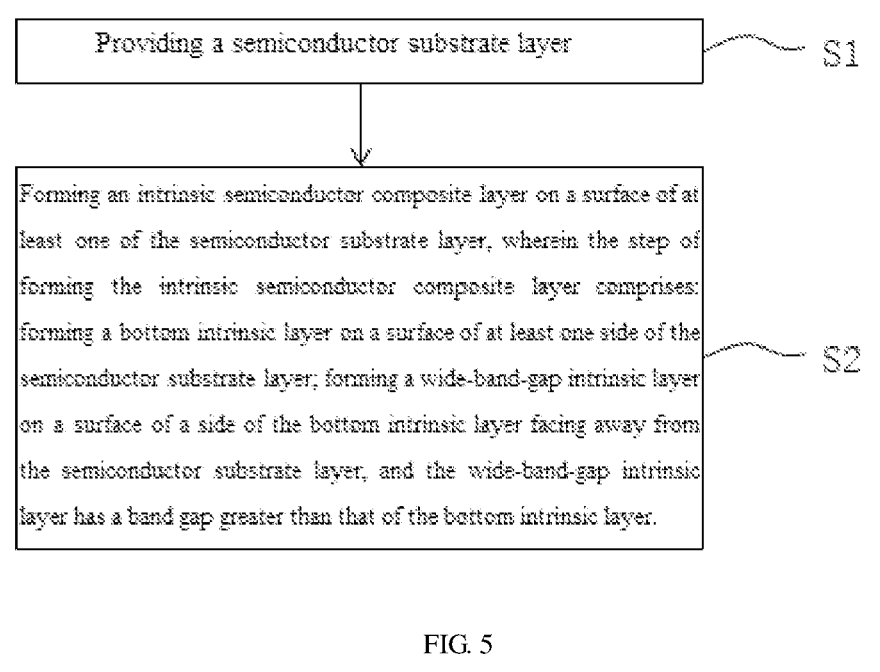

Providing a semiconductor substrate layer — S1

Forming an intrinsic semiconductor composite layer on a surface of at least one of the semiconductor substrate layer, wherein the step of forming the intrinsic semiconductor composite layer comprises: forming a bottom intrinsic layer on a surface of at least one side of the semiconductor substrate layer; forming a wide-band-gap intrinsic layer on a surface of a side of the bottom intrinsic layer facing away from the semiconductor substrate layer, and the wide-band-gap intrinsic layer has a band gap greater than that of the bottom intrinsic layer. — S2

FIG. 5

HETEROJUNCTION CELL AND METHOD FOR PREPARING SAME

CROSS REFERENCE TO RELATED APPLICATIONS

The present application claims priority to Chinese Patent Application No. 202110767660.2, entitled "Heterojunction cell and method for preparing same", and filed to the China National Intellectual Property Administration on Jul. 7, 2021, the entire contents of which are incorporated herein by reference.

TECHNICAL FIELD

The present application relates to the field of solar cell manufacturing, in particular to a heterojunction cell and a preparation method thereof.

BACKGROUND

Solar cells are clean energy cells, and it widely used in life and production. Heterojunction cell is an important solar cell. The heterojunction (HeteroJunction with intrinsic Thin layer, HJT for short) structure is centered on an N-type monocrystalline silicon substrate, and both sides of the N-type monocrystalline silicon substrate are respectively provided with a P-type amorphous silicon layer and an N-type amorphous silicon layer. An intrinsic amorphous silicon layer is added between the P-type amorphous silicon layer and N-type amorphous silicon layer and the N-type monocrystalline silicon substrate. After adopting this process, the passivation characteristics of the substrate silicon wafer are changed, thereby improving the conversion efficiency of heterojunction cells and making heterojunction cells a highly competitive solar cell technology in the market.

However, due to the parasitic absorption of sunlight by the intrinsic amorphous silicon layer itself, it will affect the conversion efficiency of the heterojunction cells, and the conversion efficiency of the heterojunction cells needs to be further improved.

SUMMARY OF THE INVENTION

Therefore, a technical problem to be solved by the present application is to overcome the problem that the conversion efficiency of the heterojunction cell needs to be further improved in the prior art, so as to provide a heterojunction cell and a preparation method thereof.

The present application provides a heterojunction cell, comprising a semiconductor substrate layer and an intrinsic semiconductor composite layer, wherein the intrinsic semiconductor composite layer is located on the surface of at least one side of the semiconductor substrate layer, and the intrinsic semiconductor composite layer comprises a bottom intrinsic layer; and a wide-band-gap intrinsic layer located on the surface of the side of the bottom intrinsic layer facing away from the semiconductor substrate layer, the band gap of the wide-band-gap intrinsic layer is greater than that of the bottom intrinsic layer.

Optionally, the intrinsic semiconductor composite layer is only located on the front side of the semiconductor substrate layer; or, the intrinsic semiconductor composite layer is only located on the back side of the semiconductor substrate layer; or, the intrinsic semiconductor composite layer is located on both sides of the semiconductor substrate layer.

Optionally, the wide-band-gap intrinsic layer comprises a first sub-wide-band-gap intrinsic layer to an Nth sub-wide-band-gap intrinsic layer, and N is an integer greater than or equal to 1.

Optionally, the material of the nth sub-wide-band-gap intrinsic layer comprises oxygen-doped amorphous silicon, carbon-doped amorphous silicon, oxygen-doped nanocrystalline silicon or carbon-doped nanocrystalline silicon; n is an integer greater than or equal to 1 and less than or equal to N.

Optionally, the bottom intrinsic layer comprises a first sub-bottom intrinsic layer; and a second sub-bottom intrinsic layer located on the surface of the side of the first sub-bottom intrinsic layer facing away from the semiconductor substrate layer; the defect state density of the second sub-bottom intrinsic layer is smaller than that of the first sub-bottom intrinsic layer.

Optionally, the ratio of a thickness of the first sub-bottom intrinsic layer to a thickness of the second sub-bottom intrinsic layer is in a range from 0.15:1 to 0.35:1; Optionally, the first sub-bottom intrinsic layer has a thickness ranging from 0.3 nm to 0.8 nm, and the second sub-bottom intrinsic layer has a thickness ranging from 1 nm to 2.5 nm; Optionally, the total thickness of the intrinsic semiconductor composite layer located on one side of the semiconductor substrate layer is in a range from 2 nm to 10 nm.

Optionally, N is an integer greater than or equal to 2, and the kth sub-wide-band-gap intrinsic layer is located between the k+1th sub-wide-band-gap intrinsic layer and the semiconductor substrate layer; k is an integer greater than or equal to 1 and less than or equal to N−1.

Optionally, N is equal to 2.

Optionally, the material of the first sub-wide-band-gap intrinsic layer comprises oxygen-doped amorphous silicon or oxygen-doped nanocrystalline silicon, and the material of the second sub-wide-band-gap intrinsic layer comprises carbon-doped amorphous silicon or carbon-doped nanocrystalline silicon, a molar ratio of oxygen to silicon in the first sub-wide-band-gap intrinsic layer is in a range from 1:1 to 1:5, and a molar ratio of carbon to silicon in the second sub-wide-band-gap intrinsic layer is in a range from 1:1 to 1:5.

Optionally, the first sub-wide-band-gap intrinsic layer has a band gap ranging from 2.0 eV to 9 eV, and the second sub-wide-band-gap intrinsic layer has a band gap ranging from 2.0 eV to 9 eV.

Optionally, the material of the first sub-wide-band-gap intrinsic layer comprises carbon-doped amorphous silicon or carbon-doped nanocrystalline silicon, and the material of the second sub-wide-band-gap intrinsic layer comprises oxygen-doped amorphous silicon or oxygen-doped nanocrystalline silicon, a molar ratio of carbon to silicon in the first sub-wide-band-gap intrinsic layer is in a range from 1:1 to 1:5, and a molar ratio of oxygen to silicon in the second sub-wide-band-gap intrinsic layer is in a range from 1:1 to 1:5.

Optionally, the first sub-wide-band-gap intrinsic layer has a band gap ranging from 2.0 eV to 9 eV, and the second sub-wide-band-gap intrinsic layer has a band gap ranging from 2.0 eV to 9 eV.

Optionally, the ratio of the thickness of the second sub-wide-band-gap intrinsic layer to the thickness of the first sub-wide-band-gap intrinsic layer is in a range from 0.5:1 to 1.5:1; the ratio of a thickness of the first sub-wide-band-gap intrinsic layer to a thickness of the bottom intrinsic layer is in a range from 0.5:1 to 1.5:1.

Optionally, the second sub-wide-band-gap intrinsic layer has a thickness ranging from 1.5 nm to 4 nm; the first sub-wide-band-gap intrinsic layer has a thickness ranging from 1.5 nm to 4 nm, and the bottom intrinsic layer has a thickness ranging from 1.3 nm to 3.3 nm.

Optionally, for the intrinsic semiconductor composite layer located on the front side of the semiconductor substrate layer, a refractive index of the k+1th sub-wide-band-gap intrinsic layer in the intrinsic semiconductor composite layer is smaller than that of the kth sub-wide-band-gap intrinsic layer.

Optionally, for the intrinsic semiconductor composite layer located on the back side of the semiconductor substrate layer, a valence band difference between the intrinsic semiconductor composite layer and the semiconductor substrate layer is in a range from 0.6 eV to 1.2 eV.

Optionally, N is equal to 1, and the wide-band-gap intrinsic layer has a band gap ranging from 2.0 eV to 9 eV.

Optionally, the ratio of the thickness of the wide-band-gap intrinsic layer to the thickness of the bottom intrinsic layer is in a range from 1:1 to 3:1.

Optionally, the wide-band-gap intrinsic layer has a thickness ranging from 2 nm to 8 nm, and the bottom intrinsic layer has a thickness ranging from 1.3 nm to 3.3 nm.

The present application also provides a method for preparing a heterojunction cell, wherein the method comprises the following steps of: providing a semiconductor substrate layer; forming an intrinsic semiconductor composite layer on the surface of at least one of the semiconductor substrate layer, wherein the step of forming the intrinsic semiconductor composite layer comprises forming a bottom intrinsic layer on the surface of at least one side of the semiconductor substrate layer; forming a wide-band-gap intrinsic layer on the surface of the side of the bottom intrinsic layer facing away from the semiconductor substrate layer, and band gap of the wide-band-gap intrinsic layer is greater than that of the bottom intrinsic layer.

Optionally, forming the intrinsic semiconductor composite layer only on the front side of the semiconductor substrate layer; or, forming the intrinsic semiconductor composite layer only on the back side of the semiconductor substrate layer; or, forming the intrinsic semiconductor composite layer on both sides of the semiconductor substrate layer.

Optionally, the step of forming the wide-band-gap intrinsic layer on the surface of the side of the bottom intrinsic layer facing away from the semiconductor substrate layer comprises: forming the first sub-wide-band-gap intrinsic layer to the Nth sub-wide-band-gap intrinsic layer sequentially on the surface of the side of the bottom intrinsic layer facing away from the semiconductor substrate layer; N is an integer greater than or equal to 1.

Optionally, the material of the nth sub-wide-band-gap intrinsic layer comprises oxygen-doped amorphous silicon, carbon-doped amorphous silicon, oxygen-doped nanocrystalline silicon or carbon-doped nanocrystalline silicon; n is an integer greater than or equal to 1 and less than or equal to N.

Optionally, N is an integer greater than or equal to 2, and the kth sub-wide-band-gap intrinsic layer is located between the k+1th sub-wide-band-gap intrinsic layer and the semiconductor substrate layer; k is an integer greater than or equal to 1 and less than or equal to N−1.

Optionally, for the intrinsic semiconductor composite layer located on the front side of the semiconductor substrate layer, a refractive index of the k+1th sub-wide-band-gap intrinsic layer in the intrinsic semiconductor composite layer is smaller than that of the kth the refractive index of the sub-wide-band-gap intrinsic layer.

Optionally, for the intrinsic semiconductor composite layer located on the back side of the semiconductor substrate layer, a valence band difference between the intrinsic semiconductor composite layer and the semiconductor substrate layer is in a range from 0.6 eV to 7.9 eV.

Optionally, the nth sub-wide-band-gap intrinsic layer is formed by a chemical vapor deposition process.

Optionally, when the material of the nth sub-wide-band-gap intrinsic layer comprises oxygen-doped amorphous silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:1 to 1:10, a volume ratio of carbon dioxide to silane being in a range from 1:1 to 1:5, a chamber pressure being in a range from 0.2 mBar to 1 mBar, and a deposition temperature being in a range from 180° C. to 240° C., and a RF power density being in a range from 150 W/m$^2$ to 600 W/m$^2$.

Optionally, when the material of the nth sub-wide-band-gap intrinsic layer comprises oxygen-doped nanocrystalline silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:20 to 1:80, a volume ratio of carbon dioxide to silane being in a range from 1:1 to 1:5, a chamber pressure being in a range from 0.5 mBar to 5 mBar, a deposition temperature being in a range from 180° C. to 240° C., and a RF power density being in a range from 500 W/m$^2$ to 2250 W/M$^2$.

Optionally, when the material of the nth sub-wide-band-gap intrinsic layer comprises carbon-doped amorphous silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:1 to 1:10, a volume ratio of carbon dioxide to silane being in a range from 1:1 to 1:5, a chamber pressure being in a range from 0.2 mBar to 1 mBar, a deposition temperature being in a range from 180° C. to 240° C., a RF power density being in a range from 150 W/m$^2$ to 600 W/m$^2$.

Optionally, when the material of the nth sub-wide-band-gap intrinsic layer comprises carbon-doped nanocrystalline silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:20 to 1:80, a volume ratio of carbon dioxide to silane being in a range from 1:1 to 1:5, a chamber pressure being in a range from 0.5 mBar to 5 mBar, a deposition temperature being in a range from 180° C. to 240° C., and a RF power density being in a range from 500 W/m$^2$ to 2250 W/m$^2$.

Optionally, the step of forming the bottom intrinsic layer comprises forming a first sub-bottom intrinsic layer on the surface of at least one side of the semiconductor substrate layer; forming a second sub-bottom intrinsic layer on the surface of the side of the first sub-bottom intrinsic layer facing away from the semiconductor substrate layer, and the defect state density of the second sub-bottom intrinsic layer is smaller than that of the first sub-bottom intrinsic layer.

The technical solution of the present application has the following beneficial effects:

1. In the heterojunction cell provided by the present application, the band gap of the wide-band-gap intrinsic layer is greater than that of the bottom intrinsic layer, the wide-band-gap intrinsic layer has a greater band gap, when sunlight irradiates a heterojunction cell, photons, the energy of which is smaller than that of the band gap of the wide-band-gap intrinsic layer, cannot be subjected to parasitic absorption, thereby reducing the parasitic absorption of sunlight by an intrinsic semiconductor composite layer, such that the absorption of the sunlight by a semiconductor substrate layer is increased, and photon-generated carriers generated by the semiconductor substrate layer are increased, thereby increasing a short-circuit current of the heterojunction cell, and improving the conversion efficiency of the heterojunction cell.

2. Further, the defect state density of the first sub-bottom intrinsic layer is relatively large, which mainly plays a role in preventing the epitaxial growth of the semiconductor substrate layer. The thickness of the first sub-bottom intrinsic layer is relatively thin to prevent photon-generated carriers from growing in the first sub-bottom intrinsic layer. The defect state density of the second sub-bottom intrinsic layer is relatively small and relatively thick, mainly playing a role in passivating the semiconductor substrate layer. There is less recombination of photon-generated carriers in the second sub-bottom intrinsic layer, which can improve the short-circuit current of heterojunction cell. At the same time, the second sub-bottom intrinsic layer serves as a transition layer between the first sub-bottom intrinsic layer and the wide-band-gap intrinsic layer, which can improve the contact performance between the wide-band-gap intrinsic layer and the first sub-bottom intrinsic layer.

3. Further, a refractive index of the k+1th sub-wide-band-gap intrinsic layer in the intrinsic semiconductor composite layer is smaller than that of the kth sub-wide-band-gap intrinsic layer, so that the refractive index of the intrinsic semiconductor composite layer on the front side of the heterojunction cell has a gradient effect. The intrinsic semiconductor composite layer on the front of the heterojunction cell has better anti-reflection performance. More sunlight enters the semiconductor substrate layer and is absorbed by the semiconductor substrate layer, which can improve the open circuit voltage of heterojunction cell.

4. Further, doping oxygen atoms or carbon atoms into the wide-band-gap intrinsic layer on the back side of the semiconductor substrate layer can improve the valence band difference between the intrinsic semiconductor composite layer on the back side of the semiconductor substrate layer and the semiconductor substrate layer. The high valence band difference enhances the cumulative effect of hole carriers in the photon-generated carriers, making the open circuit voltage of the heterojunction cell larger, improving the probability of hole carriers in the semiconductor substrate layer to directly tunnel through the intrinsic semiconductor composite layer on the back side of the semiconductor substrate layer, improving the transmission efficiency of hole carriers within the intrinsic semiconductor composite layer on the back side of the semiconductor substrate layer, reducing the resistance of heterojunction cell, and improving the conversion efficiency of heterojunction cell.

5. In the preparation method of the heterojunction cell provided by the present application, the wide-band-gap intrinsic layer has a greater band gap, when sunlight irradiates a heterojunction cell, photons, the energy of which is smaller than that of the band gap of the wide-band-gap intrinsic layer, cannot be subjected to parasitic absorption, thereby reducing the parasitic absorption of sunlight by an intrinsic semiconductor composite layer, such that the absorption of the sunlight by a semiconductor substrate layer is increased, and photon-generated carriers generated by the semiconductor substrate layer are increased, thereby increasing a short-circuit current of the heterojunction cell, and improving the conversion efficiency of the heterojunction cell.

BRIEF DESCRIPTION OF THE DRAWINGS

In order to illustrate the specific embodiments of the present invention or the technical solutions in the prior art more clearly, the following briefly introduces the accompanying drawings that need to be used in the description of the specific embodiments or the prior art. Obviously, the accompanying drawings in the following description are some embodiments of the present application. For those of ordinary skill in the art, other drawings can also be obtained based on these drawings without creative efforts.

FIG. 5 is a flowchart of a method for preparing a heterojunction cell provided by an example of the present application.

REFERENCE SIGNS

Figure 1:
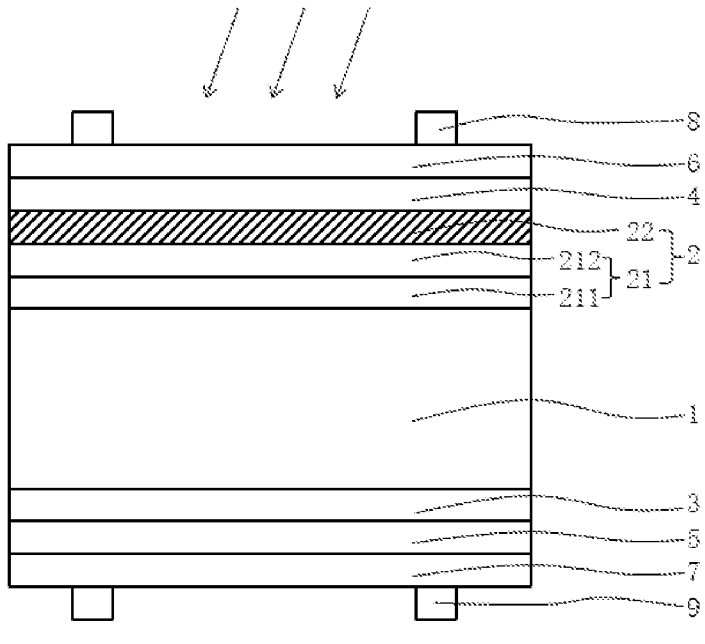
FIG. 1 is a schematic structural diagram of a heterojunction cell provided in Example 1 of the present application.

1—semiconductor substrate layer; 2—intrinsic semiconductor composite layer; 21—bottom intrinsic layer; 211—first sub-bottom intrinsic layer; 212—second sub-bottom intrinsic layer; 22—wide-band-gap intrinsic layer; 2A—front intrinsic semiconductor composite layer; 21A—front bottom intrinsic layer; 211A—the first sub-front bottom intrinsic layer; 212A—second sub-front bottom intrinsic layer; 22A—front wide-band-gap intrinsic layer; 221A—first sub-front-wide-band-gap intrinsic layer; 222A—second sub-front-wide-band-gap intrinsic layer; 3—back intrinsic layer; 3a—front intrinsic layer; 3A—back intrinsic semiconductor composite layer; 31A—back bottom intrinsic layer; 311A—first sub-back bottom intrinsic layer; 312A—second sub-back bottom intrinsic layer; 32A—back wide-band-gap intrinsic layer; 321A—first sub-back-wide-band-gap intrinsic layer; 322A—second sub-back-wide-band-gap intrinsic layer; 4—first doped layer; 5—second doped layer; 6—first transparent conductive film; 7—second transparent conductive film; 8—first gird electrode; 9—second gird electrode.

DETAILED DESCRIPTION

The technical solutions of the present application will be clearly and completely described below in conjunction with the drawings. Obviously, the described embodiments are some of the embodiments of the present application, not all of them. Based on the embodiments in this application, all other embodiments obtained by those skilled in the art without paying creative efforts belong to the scope of protection of the present application.

In the description of the present application, it should be noted that the terms "center", "upper", "lower", "left", "right", "vertical", "horizontal", "inner", "outer" etc. indicated orientation or positional relationship is based on the orientation or positional relationship shown in the drawings, and is only for the convenience of describing the present application and simplifying the description, rather than indicating or implying that the referred device or element must have a specific orientation, use a specific orientation construction and operation, therefore should not be construed as limiting the application. In addition, the terms "first", "second", and "third" are used for descriptive purposes only, and should not be construed as indicating or implying relative importance.

In the description of the present application, it should be noted that unless otherwise specified and limited, the terms "installation", "connected", and "connection" should be understood in a broad sense, for example, it can be fixed connections, removable connections, or integrated connections; it can be mechanically or electrically connected; it can be directly connected, or indirectly connected through an intermediary, or it can be the internal communication of two components, which can be wireless or wired connect. Those skilled in the art can understand the specific meanings of the above terms in the present application in specific situations.

In addition, the technical features involved in the different embodiments of the present application described below may be combined as long as they do not constitute a conflict with each other.

The present application provides a heterojunction cell, comprising a semiconductor substrate layer; and an intrinsic semiconductor composite layer, wherein the intrinsic semiconductor composite layer is located on the surface of at least one side of the semiconductor substrate layer, and the intrinsic semiconductor composite layer comprises a bottom intrinsic layer; and a wide-band-gap intrinsic layer located on the surface of the side of the bottom intrinsic layer facing away from the semiconductor substrate layer, the band gap of the wide-band-gap intrinsic layer is greater than that of the bottom intrinsic layer.

The wide-band-gap intrinsic layer has a greater band gap, when sunlight irradiates a heterojunction cell, photons, the energy of which is smaller than that of the band gap of the wide-band-gap intrinsic layer, cannot be subjected to parasitic absorption, thereby reducing the parasitic absorption of sunlight by an intrinsic semiconductor composite layer, such that the absorption of the sunlight by a semiconductor substrate layer is increased, and photon-generated carriers generated by the semiconductor substrate layer are increased, thereby increasing a short-circuit current of the heterojunction cell, and improving the conversion efficiency of the heterojunction cell.

In one embodiment, the intrinsic semiconductor composite layer is only located on the front side of the semiconductor substrate layer; or, the intrinsic semiconductor composite layer is only located on the back side of the semiconductor substrate layer; or, the intrinsic semiconductor composite layer is located on both sides of the semiconductor substrate layer.

The semiconductor substrate layer comprises an N-type monocrystalline silicon substrate, and the N-type monocrystalline silicon has a relatively narrow band gap, which is usually 1.0 eV to 1.2 eV.

The wide-band-gap intrinsic layer comprises a first sub-wide-band-gap intrinsic layer to an Nth sub-wide-band-gap intrinsic layer, and N is an integer greater than or equal to 1.

The material of the nth sub-wide-band-gap intrinsic layer comprises oxygen-doped amorphous silicon, carbon-doped amorphous silicon, oxygen-doped nanocrystalline silicon or carbon-doped nanocrystalline silicon; n is an integer greater than or equal to 1 and less than or equal to N.

Example 1

Referring to FIG. 1, the arrows in FIG. 1 point to the direction of sunlight irradiation. In this example, the heterojunction cell structure in which the intrinsic semiconductor composite layer 2 is located only on the front side of the semiconductor substrate layer 1 is taken as an example for illustration.

In this case, optionally, the wide-band-gap intrinsic layer 22 has a band gap ranging from 2.0 eV to 9 eV, such as 2.0 eV, 2.4 eV, 2.8 eV, 3.2 eV and 9 eV. Optionally, the ratio of the thickness of the wide-band-gap intrinsic layer 22 to the thickness of the bottom intrinsic layer 21 is in a range from 1:1 to 3:1, such as 1:1, 2:1 or 3:1. Optionally, the wide-band-gap intrinsic layer 22 has a thickness ranging from 2 nm to 8 nm, such as, 2 nm, 5 nm, 7 nm or 8 nm, and the bottom intrinsic layer 21 has a thickness ranging from 1.3 nm to 3.3 nm, such as, 1.3 nm, 2 nm, 3 nm or 3.3 nm.

The bottom intrinsic layer 21 comprises a first sub-bottom intrinsic layer 211; a second sub-bottom intrinsic layer 212 located on the surface of the side of the first sub-bottom intrinsic layer 211 facing away from the semiconductor substrate layer 1; the defect state density of the second sub-bottom intrinsic layer 212 is smaller than that of the first sub-bottom intrinsic layer 211; that is, the proportion of silylene group ($-SiH_2-$) in the second sub-bottom intrinsic layer 212 is smaller than the proportion of silylene group ($-SiH_2-$) in the first sub-bottom intrinsic layer 211. The defect state density of the first sub-bottom intrinsic layer 211 is relatively large, which mainly plays a role in preventing the epitaxial growth of the semiconductor substrate layer 1. The thickness of the first sub-bottom intrinsic layer 211 is relatively thin to avoid excessive recombination of photon-generated carriers in the first sub-bottom intrinsic layer 211. The defect state density of the second sub-bottom intrinsic layer 212 is relatively small and thick, mainly playing a role in passivating the semiconductor substrate layer 1. There is less recombination for the photon-generated carriers in the second sub-bottom intrinsic layer 212, which can improve the short-circuit current of heterojunction cell. At the same time, the second sub-bottom intrinsic layer 212 serves as a transition layer between the first sub-bottom intrinsic layer 211 and the wide-band-gap intrinsic layer, which can improve the contact performance between the wide-band-gap intrinsic layer 22 and the bottom intrinsic layer 21.

In this example, the ratio of the thickness of the first sub-bottom intrinsic layer 211 to the thickness of the second sub-bottom intrinsic layer 212 is in a range from 0.15:1 to 0.35:1, such as 0.15:1, 0.2:1, 0.25:1, 0.3:1 or 0.35:1.

In this example, the first sub-bottom intrinsic layer 211 has a thickness ranging from 0.3 nm to 0.8 nm, such as 0.3 nm, 0.5 nm, 0.7 nm or 0.8 nm. The defect state density of the first sub-bottom intrinsic layer 211 is relatively large, and the first sub-bottom intrinsic layer 211 mainly plays the role of preventing the epitaxial growth of the semiconductor substrate layer 1. If the first sub-bottom intrinsic layer 211 is too thin, it is difficult to achieve the effect of preventing the epitaxial growth of the semiconductor substrate layer 1. If the first sub-bottom intrinsic layer 211 is too thick, the photo-generated carriers recombine in the first sub-bottom intrinsic layer 211 too much, which will reduce the conversion efficiency of the heterojunction cell. The second sub-bottom intrinsic layer 212 has a thickness ranging from 1 nm to 2.5 nm, such as 1 nm, 1.5 nm, 2 nm or 2.5 nm. The second sub-bottom intrinsic layer 212 mainly functions to passivate the semiconductor substrate layer 1 and carrier transmission. If the second sub-bottom intrinsic layer 212 is too thin, the passivation effect of the second sub-bottom intrinsic layer 212 on the semiconductor substrate layer 1 will be reduced. If the second sub-bottom intrinsic layer 212 is too thick, the second sub-bottom intrinsic layer 212 has more parasitic absorption of sunlight and its own volume resistance is large. The carrier transmission efficiency of carriers in the second sub-bottom intrinsic layer 212 is poor, which will reduce the short-circuit current of the heterojunction cell.

Optionally, the first sub-bottom intrinsic layer 211 has a thickness of 0.5 nm, the second sub-bottom intrinsic layer 212 has a thickness of 2 nm, and the wide-band-gap intrinsic layer 22 has a thickness of 5 nm. In this case, the intrinsic semiconductor composite layer 2 has good passivation performance on the semiconductor substrate layer 1, which can reduce the recombination of photo-generated carriers on the surface of the semiconductor substrate layer 1. The intrinsic semiconductor composite layer 2 has a small volume resistance, and the intrinsic semiconductor composite layer 2 has less parasitic absorption of sunlight. At the same time, the second sub-bottom layer 212 serves as the transition layer between the first sub-bottom intrinsic layer 211 and the wide-band-gap intrinsic layer 22, which can improve the contact performance between the wide-band-gap intrinsic layer 22 and the bottom intrinsic layer 21.

The total thickness of the intrinsic semiconductor composite layer 2 located on one side of the semiconductor substrate layer 1 is in a range from 2 nm to 10 nm, such as 2 nm, 5 nm, 7 nm, 9 nm or 10 nm. The thickness of the intrinsic semiconductor composite layer 2 is relatively thin, which has less parasitic absorption of sunlight, can increase the short-circuit current of the heterojunction cell, and can improve the conversion efficiency of the heterojunction cell.

The wide-band-gap intrinsic layer 22 comprises a first sub-wide-band-gap intrinsic layer to an Nth sub-wide-band-gap intrinsic layer, and N is an integer greater than or equal to 1;

In one case, as shown in FIG. 1, the wide-band-gap intrinsic layer 22 is a single-layer structure, that is, N is equal to 1.

In another case, the wide-band-gap intrinsic layer 22 is a multi-layer structure, N is an integer greater than or equal to 2, and the kth sub-wide-gap intrinsic layer is located between the k+1th sub-wide-gap intrinsic layer and the semiconductor substrate layer; k is an integer greater than or equal to 1 and less than or equal to N−1.

The material of the nth wide-band-gap intrinsic layer comprises oxygen-doped amorphous silicon, carbon-doped amorphous silicon, oxygen-doped nanocrystalline silicon or carbon-doped nanocrystalline silicon; n is an integer greater than or equal to 1 and less than or equal to N.

In a specific embodiment, N is equal to 2, and the wide-band-gap intrinsic layer 22 comprises a first sub-wide-band-gap intrinsic layer and a second sub-wide-band-gap intrinsic layer, and the second sub-wide-band-gap intrinsic layer is located on the surface of the side of the first sub-wide-band-gap facing back to the semiconductor substrate layer 1.

In one case, the material of the first sub-wide-band-gap intrinsic layer comprises oxygen-doped amorphous silicon or oxygen-doped nanocrystalline silicon, and the material of the second sub-wide-band-gap intrinsic layer comprises carbon-doped amorphous silicon or carbon-doped nanocrystalline silicon; a molar ratio of oxygen to silicon in the first sub-wide-band-gap intrinsic layer is 1:1 to 1:5, such as 1:1, 1:2, 1:3, 1:4 or 1:5. A molar ratio of carbon to silicon in the second sub-wide-band-gap intrinsic layer is 1:1 to 1:5, such as 1:1, 1:2, 1:3, 1:4 or 1:5. Since the first sub-wide-band-gap intrinsic layer are doped with oxygen atoms, the band gap of the first sub-wide-band-gap intrinsic layer is relatively wide, and the first sub-wide-band-gap intrinsic layer has a band gap ranging from 2.0 eV to 9 eV, such as 2.0 eV, 2.4 eV, 2.6 eV, 3.2 eV or 9 eV. Since the second sub-wide-band-gap intrinsic layer are doped with carbon atoms, the band gap of the second sub-wide-band-gap intrinsic layer is relatively wide, and the second sub-wide-band-gap intrinsic layer has a band gap ranging from 2.0 eV to 9 eV, such as 2.0 eV, 2.5 eV, 2.8 eV, 3.2 eV or 9 eV.

In another case, the material of the first sub-wide-band-gap intrinsic layer comprises carbon-doped amorphous silicon or carbon-doped nanocrystalline silicon, and the material of the second sub-wide-band-gap intrinsic layer comprises oxygen-doped amorphous silicon or oxygen-doped nanocrystalline silicon. A molar ratio of carbon to silicon in the first sub-wide-band-gap intrinsic layer is 1:1 to 1:5, such as 1:1, 1:2, 1:3, 1:4 or 1:5. A molar ratio of oxygen to silicon in the second sub-wide-band-gap intrinsic layer is 1:1 to 1:5, such as 1:1, 1:2, 1:3, 1:4 or 1:5. In this case, the first sub-wide-band-gap intrinsic layer has a band gap ranging from 2.0 eV to 2.8 eV, such as 2.3 eV, 2.5 eV, 2.6 eV, 2.7 eV or 2.8 eV, and the second sub-wide-band-gap intrinsic layer has a band gap ranging from 2.0 eV to 9 eV, such as 2.0 eV, 2.2 eV, 2.6 eV, 3.2 eV or 9 eV.

The ratio of the thickness of the second sub-wide-band-gap intrinsic layer to the thickness of the first sub-wide-band-gap intrinsic layer is in a range from 0.5:1 to 1.5:1, such as 0.5:1, 0.8:1, 1:1, 1.2:1 or 1.5:1; the ratio of the thickness of the first sub-wide-band-gap intrinsic layer to the thickness of the bottom intrinsic layer is in a range from 0.5:1 to 1.5:1, such as 0.5:1, 0.8:1, 1:1, 1.2:1, 1.5:1 or 1.5:1.

The second sub-wide-band-gap intrinsic layer has a thickness ranging from 1.5 nm to 4 nm, such as 1.5 nm, 2 nm, 3 nm or 4 nm; the first sub-wide-band-gap intrinsic layer has a thickness ranging from 1.5 nm to 4 nm, such as 1.5 nm, 2 nm, 3 nm or 4 nm; the bottom intrinsic layer has a thickness of 1.3 nm to 3.3 nm, such as 1.3 nm, 2 nm, 3 nm or 3.3 nm.

For the intrinsic semiconductor composite layer 2 located on the front side of the semiconductor substrate layer 1, a refractive index of the k+1th sub-wide-band-gap intrinsic layer in the intrinsic semiconductor composite layer is smaller than that of the kth sub-wide-band-gap intrinsic layer. Specifically, the refractive index of the second sub-wide-band-gap intrinsic layer is smaller than that of the first sub-wide-band-gap first sub-wide-band-gap, so that the refractive index of the intrinsic semiconductor composite layer 2 on the front side of the heterojunction cell has a gradient effect. The intrinsic semiconductor composite layer 2 on the front of the heterojunction cell has better anti-reflection performance, and more sunlight enters the semiconductor substrate layer 1 and is absorbed by the semiconductor substrate layer 1, which can improve the open circuit voltage of the heterojunction cell.

Referring again to FIG. 1, the heterojunction cell further comprises a back intrinsic layer 3 located on the surface of the side of the semiconductor substrate layer 1 facing away from the intrinsic semiconductor composite layer 2.

The back intrinsic layer 3 may be a single-layer structure or a multi-layer structure, and is not limited thereto.

Referring again to FIG. 1, the heterojunction cell also comprises a first doped layer 4 located on the surface of the side of the intrinsic semiconductor composite layer 2 facing away from the semiconductor substrate layer 1; a first transparent conductive film 6 located on the surface of the side of the first doped layer 4 facing away from the intrinsic semiconductor composite layer 2; a first grid electrode 8 located on the surface of the side of the first transparent conductive film 6 facing away from the intrinsic semicon-ductor composite layer 2; a second doped layer 5 located on the surface of one side of the back intrinsic layer 3 facing away from the semiconductor substrate layer 1; a second transparent conductive film 7 located on the surface of the side of the second doped layer 5 facing away from the back intrinsic layer 3; a second grid electrode 9 located on the surface of the side of the second transparent conductive film 7 facing away from the second doped layer 5. It should be noted that the conductivity type of the first doped layer 4 is opposite to the conductivity type of the second doped layer 5.

Example 2

Figure 2:
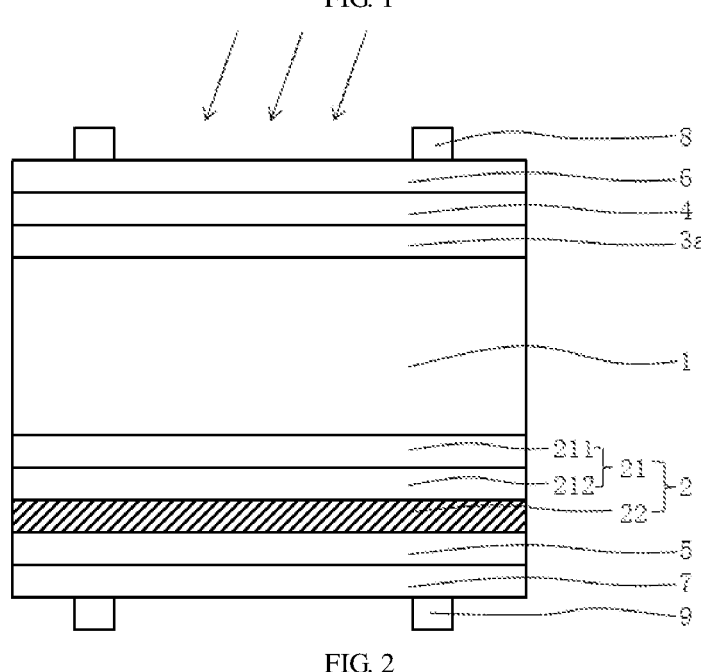
FIG. 2 is a schematic structural diagram of a heterojunction cell provided in Example 2 of the present application.

Referring to FIG. 2, in this example, the heterojunction cell structure in which the intrinsic semiconductor compos-ite layer 2 is located only on the back side of the semicon-ductor substrate layer 1 is taken as an example for illustra-tion.

For the intrinsic semiconductor composite layer 2 located on the back side of the semiconductor substrate layer 1, the valence band difference between the intrinsic semiconductor composite layer 2 and the semiconductor substrate layer 1 is in a range from 0.6 eV to 7.9 eV, such as 0.6 eV, 1.0 eV, 2.1 eV, or 7.9 eV.

Doping oxygen atoms or carbon atoms into the wide-band-gap intrinsic layer 22 can improve the valence band difference between the intrinsic semiconductor composite layer 2 on the back side of the semiconductor substrate layer 1 and the semiconductor substrate layer 1. The high valence band difference enhances the cumulative effect of hole carriers in the photon-generated carriers, making the open circuit voltage of the heterojunction cell larger, improving the probability of hole carriers in the intrinsic semiconductor composite layer 2 to directly tunnel through the intrinsic semiconductor composite layer on the back side of the semiconductor substrate layer 1, improving the transmission efficiency of hole carriers within the intrinsic semiconductor composite layer 2 on the back side of the semiconductor substrate layer 1, reducing the resistance of heterojunction cell, and improving the conversion efficiency of heterojunc-tion cell.

The wide-band-gap intrinsic layer 22 comprises a first sub-wide-band-gap intrinsic layer to an Nth sub-wide-band-gap intrinsic layer, and N is an integer greater than or equal to 1.

In one case, as shown in FIG. 2, the wide-band-gap intrinsic layer 22 is a single-layer structure, that is, N is equal to 1.

In another case, the wide-band-gap intrinsic layer 22 is a multi-layer structure, N is an integer greater than or equal to 2, and the kth sub-wide-gap intrinsic layer is located between the k+1th sub-wide-gap intrinsic layer and the semiconductor substrate layer; k is an integer greater than or equal to 1 and less than or equal to N−1.

The material of the nth wide-band-gap intrinsic layer comprises oxygen-doped amorphous silicon, carbon-doped amorphous silicon, oxygen-doped nanocrystalline silicon or carbon-doped nanocrystalline silicon; n is an integer greater than or equal to 1 and less than or equal to N.

Referring again to FIG. 2, the heterojunction cell further comprises a front intrinsic layer 3a located on the surface of the side of the semiconductor substrate layer 1 facing away from the intrinsic semiconductor composite layer 2.

The front intrinsic layer 3a can be a single-layer structure or a multi-layer structure.

For the same structural parts in this example as those of Example 1, refer to the relevant description of Example 1, and will not be described in detail here.

Example 3

Figures 3, 4:
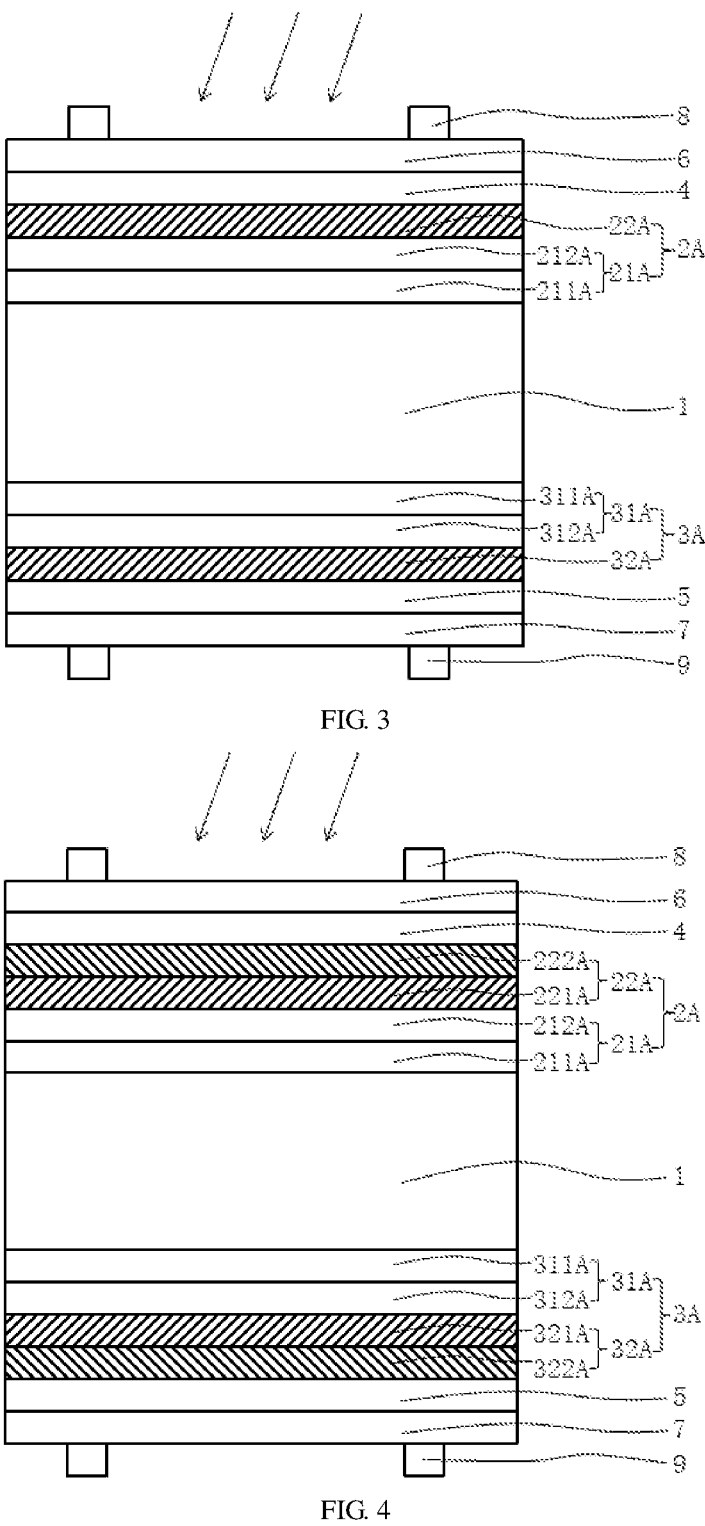
FIG. 3 is a schematic structural diagram of a heterojunction cell provided in Example 3 of the present application.
FIG. 4 is a schematic structural diagram of a heterojunction cell provided in Example 4 of the present application.

Referring to FIG. 3, in this example, the heterojunction cell structure in which the intrinsic semiconductor compos-ite layer is located on both sides of the semiconductor substrate layer 1 and the wide-band-gap intrinsic layer is a single-layer structure (that is, N is equal to 1) is taken as an example for illustration.

The intrinsic semiconductor composite layer 2 comprises a front intrinsic semiconductor composite layer 2A located on the front side of the semiconductor substrate layer 1 and a back intrinsic semiconductor composite layer 3A located on the back side of the semiconductor substrate layer 1.

The front intrinsic semiconductor composite layer 2A comprises the front bottom intrinsic layer 21A; and the front wide-band-gap intrinsic layer 22A located on the surface of the side of the front bottom intrinsic layer 21A facing away from the semiconductor substrate layer 1. The band gap of the front wide-band-gap intrinsic layer 22A is greater than that of the front bottom intrinsic layer 21A.

The back intrinsic semiconductor composite layer 3A comprises a back bottom intrinsic layer 31A; and a back wide-band-gap intrinsic layer 32A located on the surface of the side of the back side of the back bottom intrinsic layer 31A facing away from the semiconductor substrate layer 1. The band gap of the back wide-band-gap intrinsic layer 32A is greater than that of the back bottom intrinsic layer 31A.

In this example, the bottom intrinsic layer comprises a front bottom intrinsic layer 21A located on the front side of the semiconductor substrate layer 1 and a back bottom intrinsic layer 31A located on the back side of the semicon-ductor substrate layer 1. The front bottom intrinsic layer 21A comprises a first sub-front bottom intrinsic layer 211A located on the front side of the semiconductor substrate layer 1; and a second sub-front bottom intrinsic layer 212A located on the surface of the side of the first sub-front bottom intrinsic layer 211A facing away from the semiconductor substrate layer 1. The defect state density of the second sub-front bottom intrinsic layer 212A is smaller than that of the first sub-front bottom intrinsic layer 211A. The back bottom intrinsic layer 31A comprises a first sub-back bottom intrinsic layer 311A located on the back side of the semi-conductor substrate layer 1; and a second sub-back bottom intrinsic layer 312A located on the surface of the side of the first sub-back bottom intrinsic layer 311A facing away from the semiconductor substrate layer 1. The defect state density of the second sub-back bottom intrinsic layer 312A is smaller than that of the first sub-back bottom intrinsic layer 311A.

The ratio of the thickness of the first sub-front bottom intrinsic layer 211A to the thickness of the second sub-front bottom intrinsic layer 212A is in a range from 0.15:1 to 0.35:1, such as 0.15:1, 0.2:1, 0.25:1, 0.3:1 or 0.35:1. In this example, the first sub-front bottom intrinsic layer 211A has a thickness ranging from 0.3 nm to 0.8 nm, such as 0.3 nm, 0.5 nm, 0.7 nm or 0.8 nm, and the second sub-front bottom intrinsic layer 212A has a thickness ranging from 1 nm to 2.5 nm, such as 1 nm, 1.5 nm, 2 nm or 2.5 nm.

The total thickness of the front intrinsic semiconductor composite layer 2A is in a range from 2 nm to 10 nm, such as 2 nm, 5 nm, 7 nm, 9 nm or 10 nm. The total thickness of the back intrinsic semiconductor composite layer 3A is in a range from 5 nm to 10 nm, such as 5 nm, 7 nm, 9 nm or 10 nm.

The material of the front wide-band-gap intrinsic layer 22A comprises oxygen-doped amorphous silicon, carbon-doped amorphous silicon, oxygen-doped nanocrystalline silicon or carbon-doped nanocrystalline silicon. The material of the back wide-band-gap intrinsic layer 32A comprises oxygen-doped amorphous silicon, carbon-doped amorphous silicon, oxygen-doped nanocrystalline silicon or carbon-doped nanocrystalline silicon.

In a specific embodiment, the material of the front wide-band-gap intrinsic layer 22A comprises oxygen-doped amorphous silicon or oxygen-doped nanocrystalline silicon. The molar ratio of oxygen to silicon in the front wide-band-gap intrinsic layer 22A is in a range from 1:1 to 1:5, such as 1:1, 1:2, 1:3, 1:4 or 1:5. Since oxygen atoms are doped in the front wide-band-gap intrinsic layer 22A, the band gap of the front wide-band-gap intrinsic layer 22A is relatively wide, and the front wide-band-gap intrinsic layer 22A has a band gap ranging from 2.0 eV to 2.6 eV, such as 2.0 eV, 2.2 eV, 2.4 eV or 2.6 eV.

In another specific embodiment, the material of the front wide-band-gap intrinsic layer 22A comprises carbon-doped amorphous silicon or carbon-doped nanocrystalline silicon. The molar ratio of carbon to silicon in the front wide-band-gap intrinsic layer 22A is in a range from 1:1 to 1:5, such as 1:1, 1:2, 1:3, 1:4 or 1:5. Since carbon atoms are doped in the front wide-band-gap intrinsic layer 22A, the band gap of the front wide-band-gap intrinsic layer 22A is relatively wide, and the front wide-band-gap intrinsic layer 22A has a band gap ranging from 2.3 eV to 2.8 eV, such as 2.3 eV, 2.5 eV, 2.7 eV or 2.8 eV.

In a specific embodiment, the material of the back wide-band-gap intrinsic layer 32A comprises carbon-doped amorphous silicon or carbon-doped nanocrystalline silicon, and the molar ratio of carbon to silicon in the back wide-band-gap intrinsic layer 32A is in a range from 1:1 to 1:5, such as 1:1, 1:2, 1:3, 1:4, or 1:5. The back wide-band-gap intrinsic layer 32A has a band gap ranging from 2.3 Ev to 2.8 eV, such as 2.3 eV, 2.5 eV, 2.7 eV or 2.8 eV.

In another specific embodiment, the material of the back wide-band-gap intrinsic layer 32A comprises oxygen-doped amorphous silicon or oxygen-doped nanocrystalline silicon. The molar ratio of oxygen to silicon in the back wide-band-gap intrinsic layer 32A is in a range from 1:1 to 1:5, such as 1:1, 1:2, 1:3, 1:4 or 1:5. The back wide-band-gap intrinsic layer 32A has a band gap ranging from 2.0 eV to 9 eV, such as 2.0 eV, 2.4 eV, 2.6 eV, 3.2 eV or 9 eV.

The ratio of the thickness of the front wide-band-gap intrinsic layer 22A to the thickness of the front bottom intrinsic layer is in a range from 1:1 to 3:1. The front wide-band-gap intrinsic layer 22A has a thickness ranging from 2 nm to 8 nm, and the front bottom intrinsic layer has a thickness ranging from 1.3 nm to 3.3 nm.

The ratio of the thickness of the back wide-band-gap intrinsic layer 32A to the thickness of the back bottom intrinsic layer is in a range from 1:1 to 3:1. The back wide-band-gap intrinsic layer 32A has a thickness ranging from 2 nm to 8 nm, and the back bottom intrinsic layer has a thickness ranging from 1.3 nm to 3.3 nm.

In this example, the heterojunction cell also comprises a first doped layer 4 located on the surface of the side of the front intrinsic semiconductor composite layer 2A facing away from the semiconductor substrate layer 1; a first transparent conductive film 6 located on the surface of one side of the first doped layer 4 facing away from the semiconductor substrate layer 1; a first grid electrode 8 located on the surface of one side of the first transparent conductive film 6 facing away from the semiconductor substrate layer 1; a second doped layer 5 located on the surface of one side of the back intrinsic semiconductor composite layer 3A facing away from the semiconductor substrate layer 1; a second transparent conductive film 7 located on the surface of the side of the second doped layer 5 facing away from the semiconductor substrate layer 1; a second grid electrode 9 located on the surface of the side of the second transparent conductive film 7 facing away from the semiconductor substrate layer 1. It should be noted that the conductivity type of the first doped layer 4 is opposite to the conductivity type of the second doped layer 5.

For the same structural parts in this example as those of Example 1, refer to the relevant description of Example 1, and will not be described in detail here.

Example 4

In the heterojunction cell structure of this example, the intrinsic semiconductor composite layer is located on both sides of the semiconductor substrate layer 1, the wide-band-gap intrinsic layer is a laminated structure, and the wide-band-gap intrinsic layer comprises a first sub-wide-band-gap intrinsic to an Nth sub-wide-band-gap intrinsic layer, N is an integer greater than or equal to 2, and the kth sub-wide-band-gap intrinsic layer is located between the k+1th sub-wide-band-gap intrinsic layer and the semiconductor substrate layer; k is an integer greater than or equal to 1 and less than or equal to N−1.

For the intrinsic semiconductor composite layer 2 located on the front side of the semiconductor substrate layer 1, a refractive index of the k+1th sub-wide-band-gap intrinsic layer in the intrinsic semiconductor composite layer 2 is smaller than that of the kth sub-wide-band-gap intrinsic layer, so that the refractive index of the intrinsic semiconductor composite layer 2 on the front side of the heterojunction cell has a gradient effect. The intrinsic semiconductor composite layer 2 on the front of the heterojunction cell has better anti-reflection performance, and more sunlight enters the semiconductor substrate layer 1 and is absorbed by the semiconductor substrate layer 1, which can improve the open circuit voltage of heterojunction cell.

Referring to FIG. 4, N is equal to 2 as an example for illustration. The intrinsic semiconductor composite layer 2 comprises a front intrinsic semiconductor composite layer 2A located on the front side of the semiconductor substrate layer 1 and a back intrinsic semiconductor composite layer 3A located on the back side of the semiconductor substrate layer 1.

The front intrinsic semiconductor composite layer 2A comprises a front bottom intrinsic layer 21A; and a front wide-band-gap intrinsic layer 22A located on the surface of the side of the front bottom intrinsic layer 21A facing away from the semiconductor substrate layer 1. The band gap of the wide-band-gap intrinsic layer 22A is greater than that of the front bottom intrinsic layer 21A. For the description of the front bottom intrinsic layer 21A, refer to the content corresponding to Example 3, which will not be described in detail here.

The front wide-band-gap intrinsic layer 22A comprises a first sub-front-wide-band-gap intrinsic layer 221A and a second sub-front-wide-band-gap intrinsic layer 222A located on the side of the first sub-front-wide-band-gap intrinsic layer 221A facing away from the front bottom intrinsic layer 21A.

The back intrinsic semiconductor composite layer 3A comprises a back bottom intrinsic layer 31A; and a back wide-band-gap intrinsic layer 32A located on the surface of the side of the back bottom intrinsic layer 31A facing away from the semiconductor substrate layer 1. The band gap of the back wide-band-gap intrinsic layer 32A is greater than that of the back bottom intrinsic layer 31A. For the description of the back bottom intrinsic layer 31A, refer to the content corresponding to Example 3, which will not be described in detail here.

The back wide-band-gap intrinsic layer 32A comprises a first sub-back-wide-gap intrinsic layer 321A and a second sub-back-wide-gap intrinsic layer 322A located on the side of the first sub-back-wide-gap intrinsic layer 321A facing away from the back bottom intrinsic layer 31A.

In this example, the material of the first sub-front-wide-band-gap intrinsic layer 221A comprises oxygen-doped amorphous silicon or oxygen-doped nanocrystalline silicon, and the material of the second sub-front-wide-band-gap intrinsic layer 222A comprises carbon-doped amorphous silicon or carbon-doped nanocrystalline silicon; the molar ratio of oxygen to silicon in the first sub-front-wide-band-gap intrinsic layer 221A is in a range from 1:1 to 1:5, such as 1:1, 1:2, 1:3, 1:4 or 1:5, the molar ratio of carbon to silicon in the second sub-front-wide-band-gap intrinsic layer 222A is in a range from 1:1 to 1:5, such as 1:1, 1:2, 1:3, 1:1 4 or 1:5. Since the first sub-front-wide-band-gap intrinsic layer 221A are doped with oxygen atoms, the band gap of the first sub-front-wide-band-gap intrinsic layer 221A is relatively wide, and the first sub-front wide-band-gap intrinsic layer 221A has a band gap ranging from 2.0 eV to 9 eV, such as 2.0 eV, 2.4 eV, 2.6 eV, 3.2 eV or 9 eV. Since the second sub-front-wide-band-gap intrinsic layer 222A are doped with carbon atoms, the band gap of the second sub-front-wide-band-gap intrinsic layer 222A is relatively wide, the second sub-front-wide-band-gap intrinsic layer 222A has a band gap ranging from 2.0 eV to 9 eV, such as 2.0 eV, 2.5 eV, 2.8 eV, 3.2 eV or 9 eV.

In other examples, the material of the first sub-front-wide-band-gap intrinsic layer 221A comprises carbon-doped amorphous silicon or carbon-doped nanocrystalline silicon, and the material of the second sub-front-wide-band-gap intrinsic layer 222A comprises oxygen-doped amorphous silicon or oxygen-doped nanocrystalline silicon; the molar ratio of carbon to silicon in the first sub-front-wide-band-gap intrinsic layer 221A is in a range from 1:1 to 1:5, such as 1:1, 1:2, 1:3, 1:4 or 1:5, the molar ratio of oxygen to silicon in the second sub-front-wide-band-gap intrinsic layer 222A is in a range from 1:1 to 1:5, such as 1:1, 1:2, 1:3, 1:4 or 1:5. In this case, the first sub-front bottom intrinsic layer 221A has a band gap ranging from 2.0 eV to 9 eV, such as 2.0 eV, 2.5 eV, 2.8 eV, 3.2 eV or 9 eV, and the second sub-front-wide-band-gap intrinsic layer 222A has a band gap ranging from 2.0 eV to 9 eV, such as 2.0 eV, 2.4 eV, 2.6 eV, 3.2 eV or 9 eV.

The ratio of the thickness of the second sub-front-wide-band-gap intrinsic layer 222A to the thickness of the first sub-front-wide-band-gap intrinsic layer 221A is in a range from 0.5:1 to 1.5:1, such as 0.5:1, 0.8:1, 1:1, 1.2:1 or 1.5:1; the ratio of the thickness of the first sub-front-wide-band-gap intrinsic layer 221A to the thickness of the front bottom intrinsic layer 21A is in a range from 0.5:1 to 1.5:1, such as 0.5:1, 0.8:1, 1:1, 1.2:1, 1.5:1 or 1.5:1.

The second sub-front-wide-band-gap intrinsic layer 222A has a thickness ranging from 1.5 nm to 4 nm, such as 1.5 nm, 2 nm, 3 nm or 4 nm; the first sub-front-wide-band-gap intrinsic layer 221A has a thickness ranging from 1.5 nm to 4 nm, such as 1.5 nm, 2 nm, 3 nm or 4 nm; the front bottom intrinsic layer 21A has a thickness ranging from 1.3 nm to 3.3 nm, such as 1.3 nm, 2 nm, 3 nm or 3.3 nm.

For the material, thickness, and band gap of the first sub-back-wide-band-gap intrinsic layer 321A, refer to the first sub-front bottom intrinsic layer 221A; for the material, thickness, and band gap of the second sub-back-wide-band-gap intrinsic layer 322A, refer to the second sub-front-wide-band-gap intrinsic layer 222A, which will not be described in detail here.

It should be noted that, in other examples, it is also possible that the front wide-band-gap intrinsic layer 22A is a single-layer structure, the second wide-band-gap intrinsic layer 32A is a laminated structure, or the front wide-band-gap intrinsic layer 22A is a laminated layer structure, the second wide-band-gap intrinsic layer 32A is a single-layer structure.

For the same structural parts in this example as those of Example 3, refer to the relevant description of Example 3, and will not be described in detail here.

Example 5

This example provides a method for preparing a heterojunction cell, referring to FIG. 5, the method comprises the following steps of:

Step S1: providing a semiconductor substrate layer 1; and

Step S2: forming an intrinsic semiconductor composite layer 2 on the surface of at least one of the semiconductor substrate layer 1, wherein the step of forming the intrinsic semiconductor composite layer 2 comprises: forming a bottom intrinsic layer on the surface of at least one side of the semiconductor substrate layer 1; forming a wide-band-gap intrinsic layer on the surface of the side of the bottom intrinsic layer facing away from the semiconductor substrate layer 1, and the band gap of the wide-band-gap intrinsic layer is greater than that of the bottom intrinsic layer 1.

The position for forming the intrinsic semiconductor composite layer 2 comprises: forming the intrinsic semiconductor composite layer 2 only on the front side of the semiconductor substrate layer 1; or, forming the intrinsic semiconductor composite layer 2 only on the back side of the semiconductor substrate layer 1; or, forming the intrinsic semiconductor composite layer 2 on both sides of the semiconductor substrate layer 1.

The step of forming the wide-band-gap intrinsic layer on the surface of the side of the bottom intrinsic layer facing away from the semiconductor substrate layer 1 comprises: forming the first sub-wide-band-gap intrinsic layer to the Nth sub-wide-band-gap intrinsic layer sequentially on the surface of the side of the bottom intrinsic layer facing away from the semiconductor substrate layer; N is an integer greater than or equal to 1.

Optionally, a material of the nth sub-wide-band-gap intrinsic layer comprises oxygen-doped amorphous silicon, carbon-doped amorphous silicon, oxygen-doped nanocrystalline silicon or carbon-doped nanocrystalline silicon; n is an integer greater than or equal to 1 and less than or equal to N.

Optionally, N is an integer greater than or equal to 2, and the kth sub-wide-band-gap intrinsic layer is located between the k+1th sub-wide-band-gap intrinsic layer and the semiconductor substrate layer; k is an integer greater than or equal to 1 and less than or equal to N−1.

Optionally, for the intrinsic semiconductor composite layer 2 located on the front side of the semiconductor substrate layer 1, a refractive index of the k+1th sub-wide-band-gap intrinsic layer in the intrinsic semiconductor composite layer 2 is smaller than that of the kth the refractive index of the sub-wide-band-gap intrinsic layer.

Optionally, for the intrinsic semiconductor composite layer 2 located on the back side of the semiconductor substrate layer 1, a valence band difference between the intrinsic semiconductor composite layer 2 and the semiconductor substrate layer 1 is in a range from 0.6 eV to 7.9 eV, such as 0.6 eV, 1.0 eV, 1.2 eV, 2.1 eV or 7.9 eV.

When the material of the nth sub-wide-band-gap intrinsic layer comprises oxygen-doped amorphous silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:1 to 1:10, such as 1:2, 1:4, 1:6, 1:8 or 1:10; a volume ratio of carbon dioxide to silane being in a range from 1:1 to 1:5, such as 1:1, 1:2, 1:3, 1:4 or 1:5; a chamber pressure being in a range from 0.2 mBar to 1 mBar, such as 0.2 mBar, 0.4 mBar, 0.6 mBar, 0.8 mBar or 1 mBar; and a deposition temperature being in a range from 180° C. to 240° C., such as 180° C., 200° C., 220° C. or 240° C.; and a RF power density being in a range from 150 W/m$^2$ to 600 W/m$^2$, such as 150 W/m$^2$, 250 W/m$^2$, 350 W/M$^2$, 450 W/M$^2$, 550 W/m$^2$ or 600 W/m$^2$.

When the material of the nth sub-wide-band-gap intrinsic layer comprises oxygen-doped nanocrystalline silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:20 to 1:80, such as 1:20, 1:40, 1:60 or 1:80; a volume ratio of carbon dioxide to silane being in a range from 1:1 to 1:5, a chamber pressure being in a range from 0.5 mBar to 5 mBar, such as 0.5 mBar, 1 mBar, 3 mBar, 4 mBar or 5 mBar; a deposition temperature being in a range from 180° C. to 240° C., such as 180° C., 200° C., 220° C. or 240° C.; and a RF power density being in a range from 500 W/m$^2$ to 2250 W/M$^2$ such as 2500 W/m$^2$, 1000 W/m$^2$, 1500 W/m$^2$, 2000 W/m$^2$ or 2250 W/m$^2$.

When the material of the sub-wide-band-gap intrinsic layer comprises carbon-doped amorphous silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:1 to 1:10, such as 1:2, 1:4, 1:6, 1:8 or 1:10; a volume ratio of carbon dioxide to silane being in a range from 1:1 to 1:5, such as 1:1, 1:2, 1:3, 1:4 or 1:5; a chamber pressure being in a range from 0.2 mBar to 1 mBar, such as 0.2 mBar, 0.4 mBar, 0.6 mBar, 0.8 mBar or 1 mBar; a dfeposition temperature being in a range from 180° C. to 240° C., such as 180° C., 200° C., 220° C. or 240° C.; a RF power density being in a range from 150 W/m$^2$ to 600 W/m$^2$, such as 150 W/m$^2$, 250 W/m$^2$, 350 W/m$^2$, 450 W/m$^2$, 550 W/m$^2$ or 600 W/m$^2$.

When the material of the sub-wide-band-gap intrinsic layer comprises carbon-doped nanocrystalline silicon, the process for forming the nth sub-wide-band-gap intrinsic layer comprises the following parameters of: the gases used comprising silane, hydrogen and carbon dioxide, wherein, a volume ratio of silane to hydrogen being in a range from 1:20 to 1:80, such as 1:20, 1:40, 1:60 or 1:80; a volume ratio of carbon dioxide to silane being in a range from 1:1 to 1:5, such as 1:1, 1:2, 1:3, 1:4 or 1:5; a chamber pressure being in a range from 0.5 mBar to 5 mBar, such as 0.5 mBar, 1 mBar, 3 mBar, 4 mBar or 5 mBar; a deposition temperature being in a range from 180° C. to 240° C., such as 180° C., 200° C., 220° C. or 240° C.; and a RF power density being in a range from 500 W/m$^2$ to 2250 W/m$^2$, such as 500 W/m$^2$, 1000 W/m$^2$, 1500 W/m$^2$, 2000 W/m$^2$ or 2250 W/M$^2$.

Optionally, the step of forming the bottom intrinsic layer comprises forming a first sub-bottom intrinsic layer 211 on the surface of at least one side of the semiconductor substrate layer 1; forming a second sub-bottom intrinsic layer 212 on the surface of the side of the first sub-bottom intrinsic layer 211 facing away from the semiconductor substrate layer 1, and the defect state density of the second sub-bottom intrinsic layer 212 is smaller than that of the first sub-bottom intrinsic layer 211.

Figure 6:
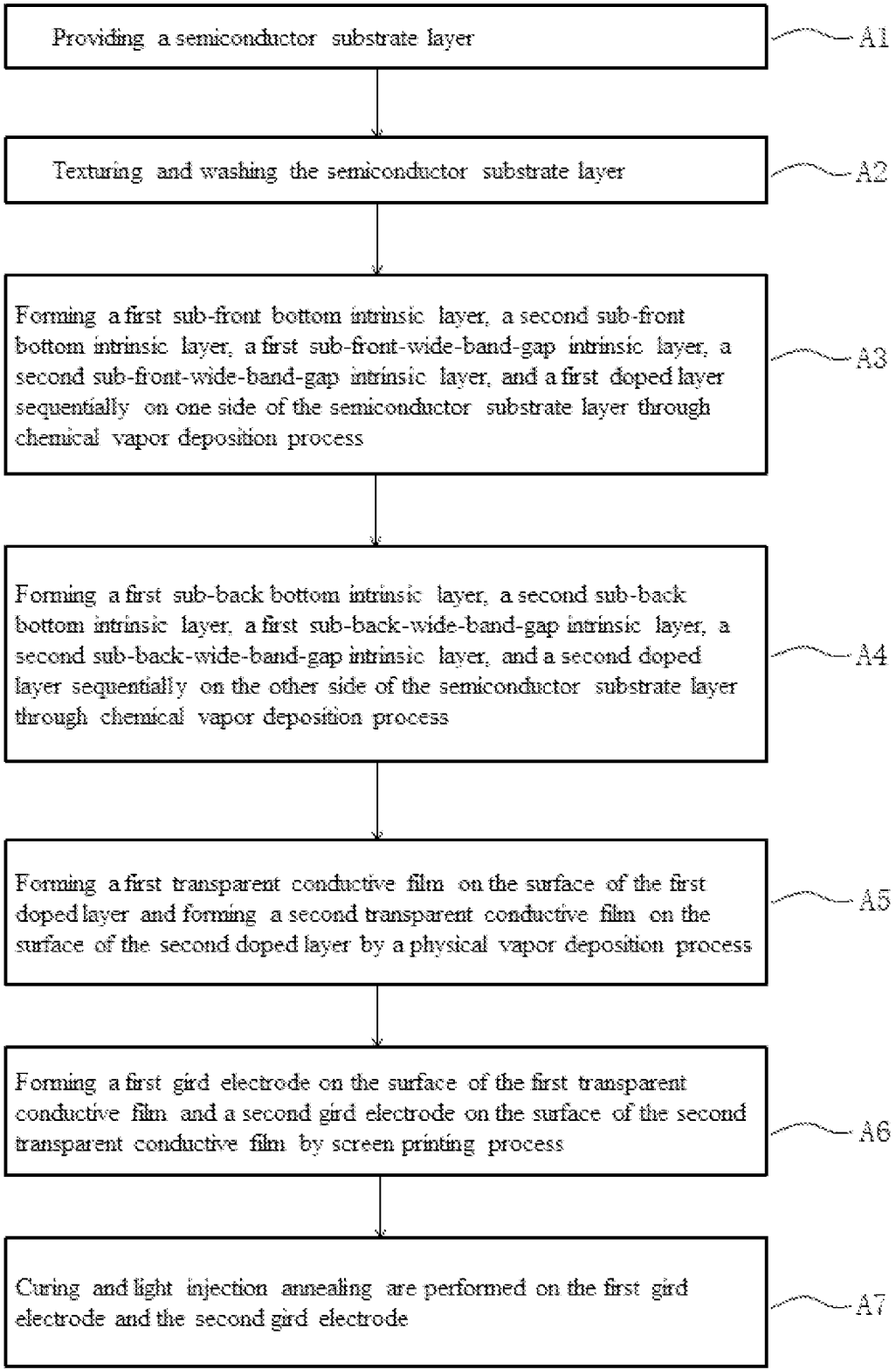
FIG. 6 is a flowchart of a method for preparing a heterojunction cell provided by Example 4 of the present application.

Referring to FIG. 6, taking the heterojunction cell provided in Example 4 as an example, that is, the front intrinsic semiconductor composite layer 2A comprises a first sub-front-wide-band-gap intrinsic layer 221A and a second sub-front-wide-band-gap intrinsic layer 221A. The laminated structure of layer 222A and the laminated structure of the first sub-rear wide-band-gap intrinsic layer 321A and the second sub-back-wide-band-gap intrinsic layer 322A in the back intrinsic semiconductor composite layer 3A are taken as examples. For heterojunction cells, the preparation method is described in detail:

Step A1: providing a semiconductor substrate layer.

The semiconductor substrate layer comprises an N-type single crystal silicon substrate.

Step A2: texturing and washing the semiconductor substrate layer 1.

Texturing to semiconductor substrate layer is carried out to form light-trapping structure on the surface of semiconductor substrate layer 1, the reflection of sunlight is reduced, after texturing process, semiconductor substrate layer 1 is washed to remove the oxide layer and impurities on the surface of the semiconductor substrate layer 1.

Step A3: forming a first sub-front bottom intrinsic layer 211A, a second sub-front bottom intrinsic layer 212A, a first sub-front-wide-band-gap intrinsic layer 221A, a second sub-front-wide-band-gap intrinsic layer 222A, and a first doped layer sequentially on one side of the semiconductor substrate layer 1 through chemical vapor deposition process.

For the process parameters of forming the first sub-front-wide-band-gap intrinsic layer 221A and the second sub-front-wide-band-gap intrinsic layer 222A, refer to the above description.

Step A4: forming a first sub-back bottom intrinsic layer 311A, a second sub-back bottom intrinsic layer 312A, a first sub-back-wide-band-gap intrinsic layer 321A, a second sub-back-wide-band-gap intrinsic layer 322A, and a second doped layer sequentially on the other side of the semiconductor substrate layer 1 through chemical vapor deposition process.

For the process parameters of forming the sub-back-wide-band-gap intrinsic layer 321A and the second sub-back-wide-band-gap intrinsic layer 322A, refer to the above description.

It should be noted that, in other examples, it is also possible to form the first doped layer and the second doped layer after forming the second sub-front-wide-band-gap intrinsic layer 222A and the second sub-front-wide-band-gap intrinsic layer 322A.

Step A5: forming a first transparent conductive film 6 on the surface of the first doped layer and forming a second transparent conductive film 7 on the surface of the second doped layer by a physical vapor deposition process.

The amorphous silicon structure is a disordered structure, the mobility of electrons and holes is low, and the lateral conductivity is poor, which is not conducive to the collection of photo-generated carriers. The first transparent conductive film 6 and the second transparent conductive film 7 are used to collect carriers and transport them to the electrode.

Step A6: forming a first gird electrode 8 on the surface of the first transparent conductive film and a second gird electrode 9 on the surface of the second transparent conductive film 7 by screen printing process.

The first gird electrode 8 is used to collect the current transmitted by the first transparent conductive film 6, and the second gird electrode 9 is used to collect the current transmitted by the second transparent conductive film 7.

Step A7: curing and light injection annealing are performed on the first gird electrode 8 and the second gird electrode 9.

At a certain temperature, the surface of the heterojunction cell is irradiated with strong light for a certain period of time to improve the conversion efficiency of the heterojunction cell.

In the method for preparing the heterojunction cell provided in this example, the band gap the wide-band-gap intrinsic layer is greater than that of the bottom intrinsic layer, the band gap of the wide-band-gap intrinsic layer is greater, when sunlight irradiates the heterojunction cell, photons, the energy of which is smaller than that of the band gap of the wide-band-gap intrinsic layer, cannot be subjected to parasitic absorption, thereby reducing the parasitic absorption of sunlight by an intrinsic semiconductor composite layer, such that the absorption of the sunlight by a semiconductor substrate layer is increased, and photon-generated carriers generated by the semiconductor substrate layer are increased, thereby increasing a short-circuit current of the heterojunction cell, and improving the conversion efficiency of the heterojunction cell.

Obviously, the above-mentioned embodiments are only examples to clearly illustrate the technical points of the present application, and are not intended to limit the implementation. For those of ordinary skill in the art, changes or modifications in other different forms can also be made on the basis of the above description. It is not necessary and impossible to exhaustively enumerate all implementations, and the obvious changes or modifications derived therefrom are still within the protection scope of the present invention.

The invention claimed is:

1. A heterojunction cell, wherein the heterojunction cell comprises a semiconductor substrate layer; and an intrinsic semiconductor composite layer, wherein the intrinsic semiconductor composite layer is located on a surface of at least one side of the semiconductor substrate layer, and the intrinsic semiconductor composite layer comprises a bottom intrinsic layer; and a wide-band-gap intrinsic layer located on the surface of the side of the bottom intrinsic layer facing away from the semiconductor substrate layer, the band gap of the wide-band-gap intrinsic layer is greater than that of the bottom intrinsic layer;

the wide-band-gap intrinsic layer comprises a first sub-wide-band-gap intrinsic layer to an Nth sub-wide-band-gap intrinsic layer, and N is an integer greater than or equal to 2; a kth sub-wide-band-gap intrinsic layer is located between the k+1th sub-wide-band-gap intrinsic layer and the semiconductor substrate layer; k is an integer greater than or equal to 1 and less than or equal to N−1;

for the intrinsic semiconductor composite layer located on a front side of the semiconductor substrate layer, a refractive index of the k+1th sub-wide-band-gap intrinsic layer in the intrinsic semiconductor composite layer is smaller than that of the kth sub-wide-band-gap intrinsic layer.

2. The heterojunction cell of claim 1, wherein the intrinsic semiconductor composite layer is only located on the front side of the semiconductor substrate layer; or, the intrinsic semiconductor composite layer is only located on the back side of the semiconductor substrate layer; or, the intrinsic semiconductor composite layer is located on both sides of the semiconductor substrate layer.

3. The heterojunction cell of claim 2, wherein a material of the nth sub-wide-band-gap intrinsic layer comprises oxygen-doped amorphous silicon, carbon-doped amorphous silicon, oxygen-doped nanocrystalline silicon or carbon-doped nanocrystalline silicon; n is an integer greater than or equal to 1 and less than or equal to N.

4. The heterojunction cell of claim 3, wherein N is equal to 2.5.

5. The heterojunction cell of claim 1, wherein N is equal to 2, and the wide-band-gap intrinsic layer has a band gap ranging from 2.0 eV to 9 eV;

a ratio of a thickness of the wide-band-gap intrinsic layer to the thickness of the bottom intrinsic layer is in a range from 1:1 to 3:1; and the wide-band-gap intrinsic layer has a thickness ranging from 2 nm to 8 nm, and the bottom intrinsic layer has a thickness ranging from 1.3 nm to 3.3 nm.

6. The heterojunction cell of claim 2, wherein the bottom intrinsic layer comprises a first sub-bottom intrinsic layer; a second sub-bottom intrinsic layer located on the surface of the side of a first sub-bottom intrinsic layer facing away from the semiconductor substrate layer; the defect state density of the second sub-bottom intrinsic layer is smaller than that of the first sub-bottom intrinsic layer.

7. The heterojunction cell of claim 6, wherein a ratio of a thickness of the first sub-bottom intrinsic layer to a thickness of the second sub-bottom intrinsic layer is in a range from 0.15:1 to 0.35:1.

8. The heterojunction cell of claim 7, wherein the first sub-bottom intrinsic layer has a thickness ranging from 0.3 nm to 0.8 nm, and the second sub-bottom intrinsic layer has a thickness ranging from 1 nm to 2.5 nm.

9. The heterojunction cell of claim 2, wherein a total thickness of the intrinsic semiconductor composite layer located on one side of the semiconductor substrate layer is in a range from 2 nm to 10 nm.

10. The heterojunction cell of claim 2, wherein the material of the first sub-wide-band-gap intrinsic layer comprises oxygen-doped amorphous silicon or oxygen-doped nanocrystalline silicon, and the material of a second subwide-band-gap intrinsic layer comprises carbon-doped amorphous silicon or carbon-doped nanocrystalline silicon, a molar ratio of oxygen to silicon in the first sub-wide-band-gap intrinsic layer is in a range from 1:1 to 1:5.

11. The heterojunction cell of claim 3, wherein the first sub-wide-band-gap intrinsic layer has a band gap ranging from 2.0 eV to 9 eV, and the second sub-wide-band-gap intrinsic layer has a band gap ranging from 2.0 eV to 9 eV.

12. The heterojunction cell of claim 3, wherein the material of the first sub-wide-band-gap intrinsic layer comprises carbon-doped amorphous silicon or carbon-doped nanocrystalline silicon, and the material of the second sub-wide-band-gap intrinsic layer comprises oxygen-doped amorphous silicon or oxygen-doped nanocrystalline silicon, a molar ratio of carbon to silicon in the first sub-wide-band-gap intrinsic layer is in a range from 1:1 to 1:5, and a molar ratio of oxygen to silicon in the second sub-wide-band-gap intrinsic layer is in a range from 1:1 to 1:5.

13. The heterojunction cell of claim 3, wherein a ratio of a thickness of the second sub-wide-band-gap intrinsic layer to the thickness of the first sub-wide-band-gap intrinsic layer is in a range from 0.5:1 to 1.5:1; a ratio of a thickness of the first sub-wide-band-gap intrinsic layer to a thickness of the bottom intrinsic layer is in a range from 0.5:1 to 1.5:1.

14. The heterojunction cell of claim 13, wherein the second sub-wide-band-gap intrinsic layer has a thickness ranging from 1.5 nm to 4 nm; the first sub-wide-band-gap intrinsic layer has a thickness ranging from 1.5 nm to 4 nm, and the bottom intrinsic layer has a thickness ranging from 1.3 nm to 3.3 nm.

15. The heterojunction cell of claim 3, wherein for the intrinsic semiconductor composite layer located on the back side of the semiconductor substrate layer, a valence band difference between the intrinsic semiconductor composite layer and the semiconductor substrate layer is in a range from 0.6 eV to 7.9 eV.

* * * * *